United States Patent
Lemoff

(10) Patent No.: US 7,076,129 B2
(45) Date of Patent: Jul. 11, 2006

(54) APPARATUS AND METHOD FOR A FILTERLESS PARALLEL WDM MULTIPLEXER

(76) Inventor: Brian E. Lemoff, 4844 Tammy Ct., Union City, CA (US) 94587

(*) Notice: Subject to any disclaimer, the term of this patent is extended or adjusted under 35 U.S.C. 154(b) by 166 days.

(21) Appl. No.: 10/428,199

(22) Filed: Apr. 30, 2003

(65) Prior Publication Data

US 2004/0218854 A1  Nov. 4, 2004

(51) Int. Cl.
*G02B 6/28* (2006.01)
(52) U.S. Cl. .......................................... 385/24
(58) Field of Classification Search ................ 385/24
See application file for complete search history.

(56) References Cited

U.S. PATENT DOCUMENTS

| 5,078,499 A | 1/1992 | LeMarche |
|---|---|---|
| 5,973,844 A | 10/1999 | Burger |
| 6,078,708 A | 6/2000 | de la Tocnay et al. |
| 6,088,376 A | 7/2000 | O'Brien et al. |
| 6,122,417 A * | 9/2000 | Jayaraman et al. ........... 385/24 |
| 6,353,502 B1 | 3/2002 | Marchant et al. |
| 6,400,513 B1 | 6/2002 | Southwell |
| 6,419,404 B1 | 7/2002 | Deri et al. |
| 2002/0009258 A1 | 1/2002 | Coldren et al. |
| 2002/0106156 A1* | 8/2002 | Vail et al. ..................... 385/37 |

FOREIGN PATENT DOCUMENTS

WO    01/76495 A2   10/2001

* cited by examiner

*Primary Examiner*—John R. Lee
*Assistant Examiner*—Phillip A. Johnston

(57) ABSTRACT

A method and apparatus for a filterless parallel WDM multiplexer is disclosed. The filterless multiplexer comprises two or more planes of lenses to allow light to be directed into a number of waveguides. The filterless multiplexer may be have either refractive or diffractive lenses.

20 Claims, 5 Drawing Sheets

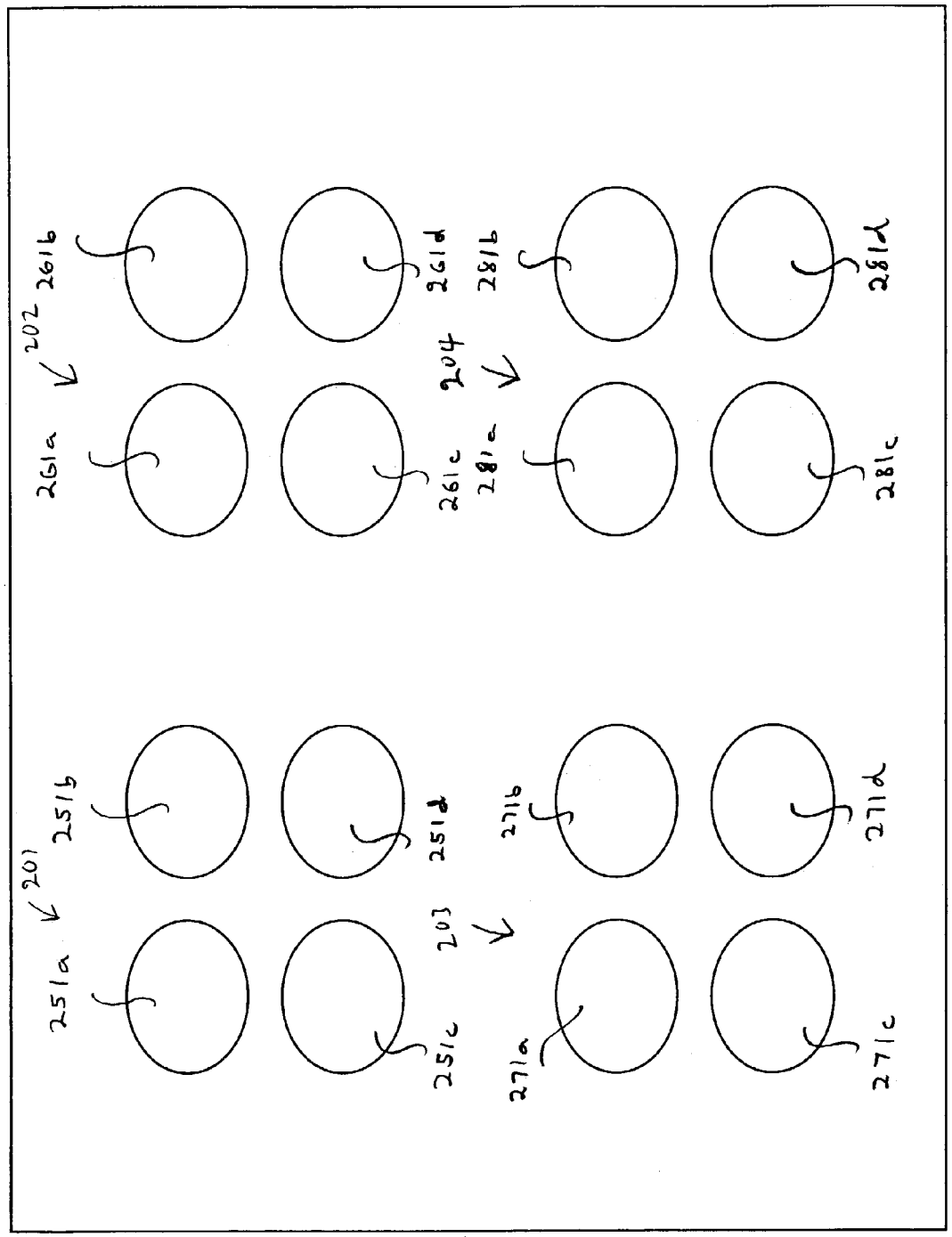

APPARATUS AND METHOD FOR A FILTERLESS PARALLEL WDM MULTIPLEXER

CROSS REFERENCE TO RELATED APPLICATIONS

This application is related to the patent application Ser. No. 10/427,671 entitled "VCSEL ARRAY CONFIGURATION FOR A PARALLEL WDM TRANSMITTER", filed on the same day and assigned to the same assignee.

BACKGROUND OF THE INVENTION

Parallel optics and wavelength division multiplexing (WDM) are two optical communication techniques that permit increased bandwidth density in optical communications systems. In parallel optics, multiple optical signals are transmitted in parallel along a multi-optical fiber ribbon, with a single optical signal being transmitted on each optical fiber. In WDM, multiple optical data signals are combined and transmitted on a single optical fiber, with each optical signal being carried on a different wavelength. In parallel WDM, the two techniques are combined by transmitting multiple optical wavelengths through each optical fiber of a parallel optical fiber ribbon. A key component of a parallel WDM system is a parallel WDM multiplexer, an optical device that combines multiple optical beams into a single optical fiber.

In some implementations of parallel WDM, the optical transmitter includes an array of vertical cavity surface emitting lasers (VCSELs). The number of VCSELs in the array is typically equal to the number of optical fibers in the optical fiber ribbon multiplied by the number of wavelengths in each optical fiber. The optical multiplexer serves to couple light from one VCSEL of each wavelength into each optical fiber in the optical fiber ribbon. Typical multiplexers use wavelength selective means such as dielectric interference filters or diffraction gratings to accomplish this.

SUMMARY OF THE INVENTION

In accordance with the invention, a filterless parallel WDM multiplexer using simple wavelength insensitive sets of lenses to combine light beams is described. A general array of beams of arbitrary configuration is mapped into a grouping of lenses in an arbitrary, tightly spaced configuration such as micro-lens arrays and then mapped into an array of optical fibers. The optical fibers may be arranged into a linear array such as a ribbon or a two dimensional array such as a fiber bundle.

In embodiments where a single mode fiber is used, a wavelength-insensitive combiner introduces an inherent insertion loss equal to dividing the incident power at each wavelength by the number of wavelengths. If multimode fiber is used this inherent loss is not present if the phase space volume of the optical fiber exceeds the sum of the phase space volumes of all the incident beams. Hence, embodiments in accordance with the invention provide simple and low-cost optical devices for multiplexing multiple wavelengths into a fiber with minimal insertion loss.

Typical embodiments in accordance with the invention have at least two planes containing lenses. Two planes may be on two sides of an optically transparent wafer made of glass or semiconductor material or on two separate wafers that are attached or separated by a gap such as an air gap. Lenses may be either refractive or diffractive, spherical or aspherical. Lenses in the various planes may be the same or different and the lens material may be glass, plastic, silicon, GaAs, InP, GaP or other material that is optically transparent in the wavelength range of interest.

BRIEF DESCRIPTION OF THE DRAWINGS

FIG. 2b shows a first plane of lenses in an embodiment in accordance with the invention.

DETAILED DESCRIPTION OF THE INVENTION

Figure 1:
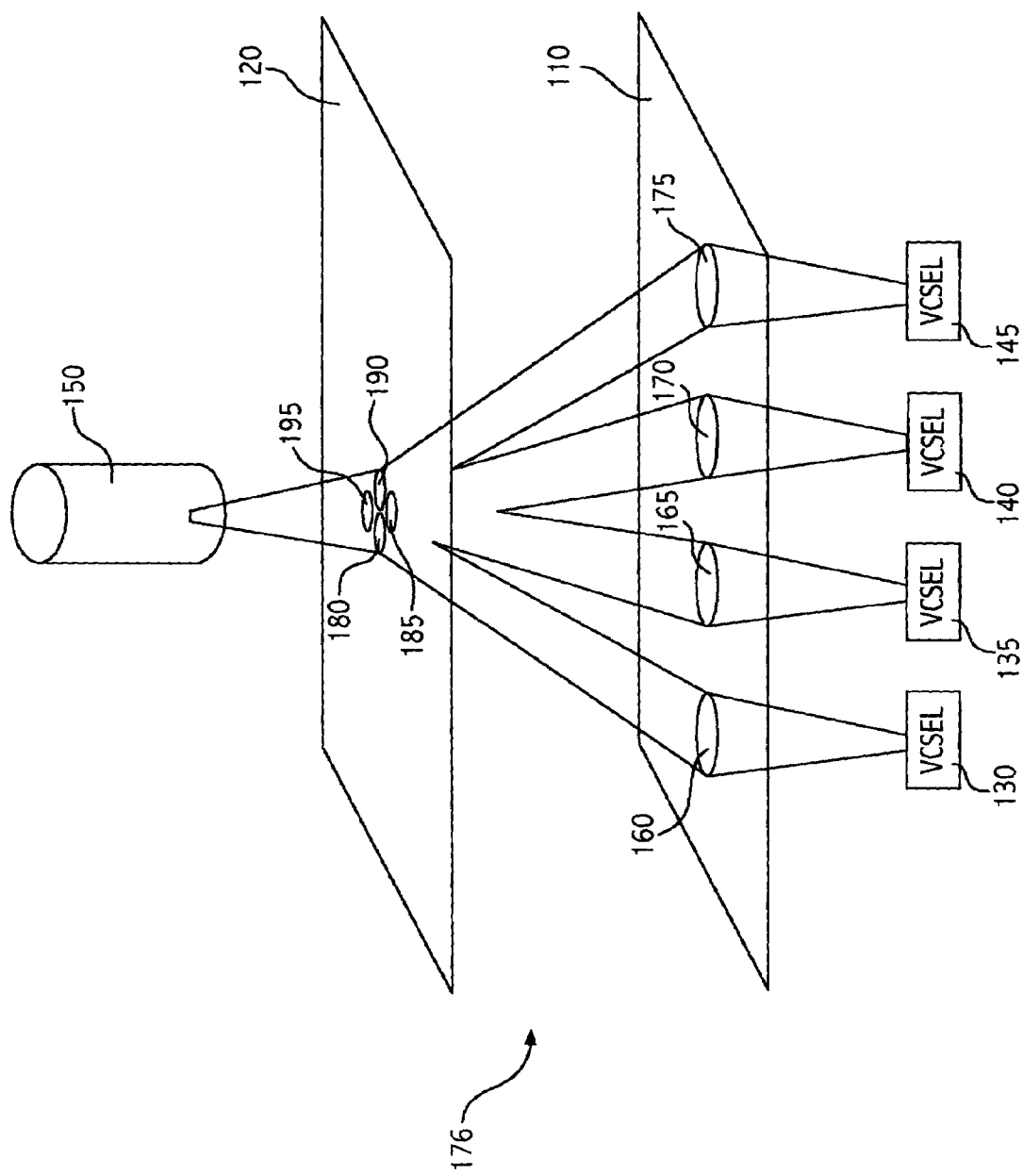
FIG. 1 shows a conceptual view of an embodiment in accordance with the invention.

FIG. 1 shows a conceptual view of filterless parallel WDM multiplexer element 176 in accordance with the invention. Using two or more filterless parallel WDM multiplexer elements such as filterless parallel WDM multiplexer element 176 together, one filterless parallel WDM multiplexer element for each optical fiber, results in a filterless parallel WDM multiplexer in accordance with the invention. Filterless parallel WDM multiplexer element 176 directs light from VCSELs 130, 135, 140, 145 to optical fiber 150. Each one of VCSELs 130, 135, 140, 145 operates at a different wavelength. A typical configuration for VCSELs 130, 135, 140, 145 may be a linear array having a 250 micron pitch. Optical sources other than VCSELs such as edge emitting lasers may also be used.

Filterless parallel WDM multiplexer element 176 includes plane 110 containing lenses 160, 165, 170, 175 to provide a lens for each incident beam. Lenses 160, 165, 170, 180 map the light from each VCSEL 130, 135, 140, 145 to spots on lenses 180, 185, 190, 195, respectively, in plane 120. Lenses 180, 185, 190, 195 are configured in a dense pattern to allow focusing the light beams onto the aperture of optical fiber 150. The number of optical light sources and lenses may be increased along with the number of optical fibers. For example, filterless parallel WDM multiplexer element 176 shown in FIG. 1 may be repeated 12 times, resulting in a filterless parallel WDM multiplexer to image a 4 by 12 array of VCSELs into a 1 by 12 optical fiber ribbon.

Typically, an embodiment in accordance with the invention such as filterless parallel WDM multiplexer element 176 has at least two planes of lenses as seen in FIG. 1. The planes of lenses may be implemented on two sides of an optically transparent wafer made from, for example, glass, plastic, silicon, GaAs, InP, GaP or any other material that is optically transparent in the wavelength range of interest. In another embodiment, the planes may be implemented on separate wafers, each wafer having a plane of lenses. The wafers may be in contact with each other or have an intervening material such as air between them.

General design considerations for embodiments in accordance with the invention such as filterless parallel WDM multiplexer element 176 follow and are discussed with respect to but not limited to FIG. 1. Because a VCSEL, such as VCSEL 130, typically emits a vertical cone of light, the center of the aperture of lens 160 in plane 110, should be aligned with the aperture of VCSEL 130 to capture the VCSEL light. In the case that the sources are edge emitting lasers, the emitted beam is astigmatic and the lenses of filterless parallel WDM multiplexer element 176 and other embodiments in accordance with the invention need to be biconic lenses.

In order to direct light from lens 160 in plane 110 to the appropriate lens in plane 120, the vertex of lens 160 must lie on the line connecting the aperture of VCSEL 130 to the center of the aperture of lens 180 in plane 120. The vertex for lens 130 is taken to be the point on the extended lens surface that is closest to the plane in which VCSELs 130, 135, 140, 145 or other suitable optical light sources reside. This results in an offset between the center of the aperture of lens 160 and the vertex of lens 160. Therefore, lens 160 is an off-axis section of a lens. Lens 180 in plane 120 needs to be large enough to capture most of the light incident on it and focus this light into optical fiber 150. Lens 180 in plane 120 focuses the incident light into optical fiber 150 that is positioned to minimize the overall range of angles of the incident light going into optical fiber 150. Because lens 180 in plane 120 needs to focus the incident light into optical fiber 150, the line connecting the center of optical fiber 150 with the vertex of lens 180 needs to be parallel to the incident light. By design, the incident light is parallel to the line connecting the aperture of VCSEL 130 to the center of lens 180 in plane 120. The vertex of lens 180 is taken to be the point on the extended lens surface that is closest to the plane of the aperture of optical fiber 150. This requires that there be an offset between the center of the aperture of lens 180 in plane 120 and the vertex of lens 180. Hence, lens 180 in plane 120 is also off-axis. Lenses 165, 170, 175, 185, 190, 195 of filterless parallel WDM multiplexer element 176 and any additional optical fibers and lenses associated with additional filterless parallel multiplexer elements are similarly positioned. Optical fiber 150 and other optical fibers used in accordance with the invention may be single-mode or multimode optical fiber. Optical fiber 150 may be replaced by any known waveguide. If a single-mode optical fiber is used, embodiments in accordance with the invention such as filterless parallel WDM multiplexer element 176 introduces an insertion loss equal to a factor at least as large as the number of wavelengths being combined into a single optical fiber. Hence, for the example of filterless parallel WDM multiplexer element 176 that combines four wavelengths into optical fiber 150, if optical fiber 150 is a single-mode optical fiber there is an inherent minimum 6-db insertion loss. The inherent loss is not present if optical fiber 150 is a multimode fiber. If a phase space volume is defined as the beam area multiplied by the solid angle, then a low loss filterless parallel WDM multiplexer can be implemented provided that the phase space volume of each optical fiber, such as, for example, optical fiber 150, is greater than the sum of the phase space volumes of the incident optical beams.

The general design considerations discussed above assume that VCSELs 130, 135, 140, 145 are point sources. This assumption is an approximation. Additional assumptions have neglected diffraction and lens aberrations. The design implementation of filterless parallel WDM multiplexer element 176 in accordance with the invention corrects for these factors and embodiments typically will differ from the above description which, however, results in a baseline design that is qualitatively similar to the typical embodiments. In practice, the qualitative description provides a starting configuration that may be iteratively modified using ray tracing software packages such as ZEMAX® or CODE V® until the amount of VCSEL light reaching the optical fiber has been optimized.

Figure 2A:
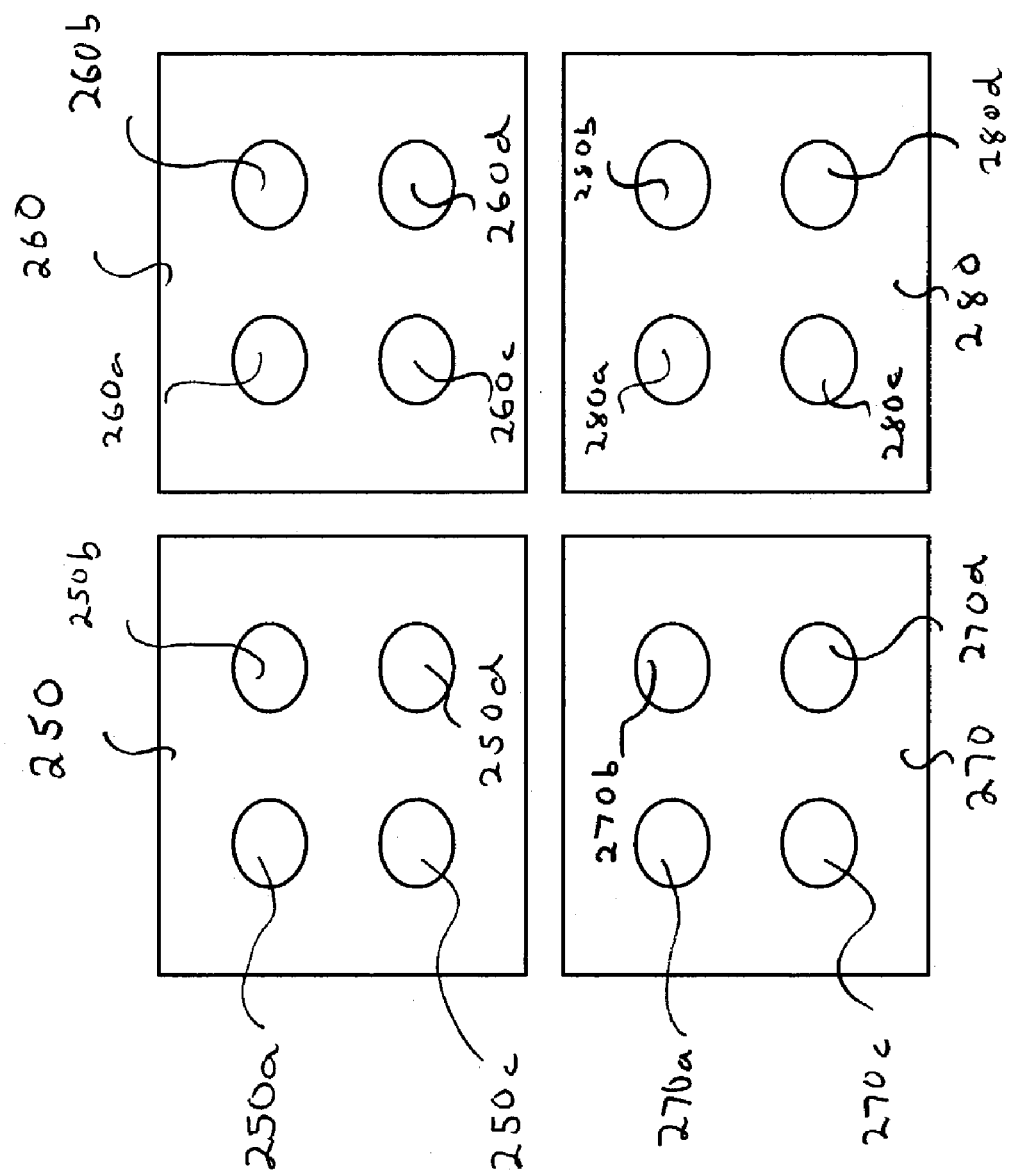
FIG. 2a shows a VCSEL die configuration in an embodiment in accordance with the invention.
Figure 3:
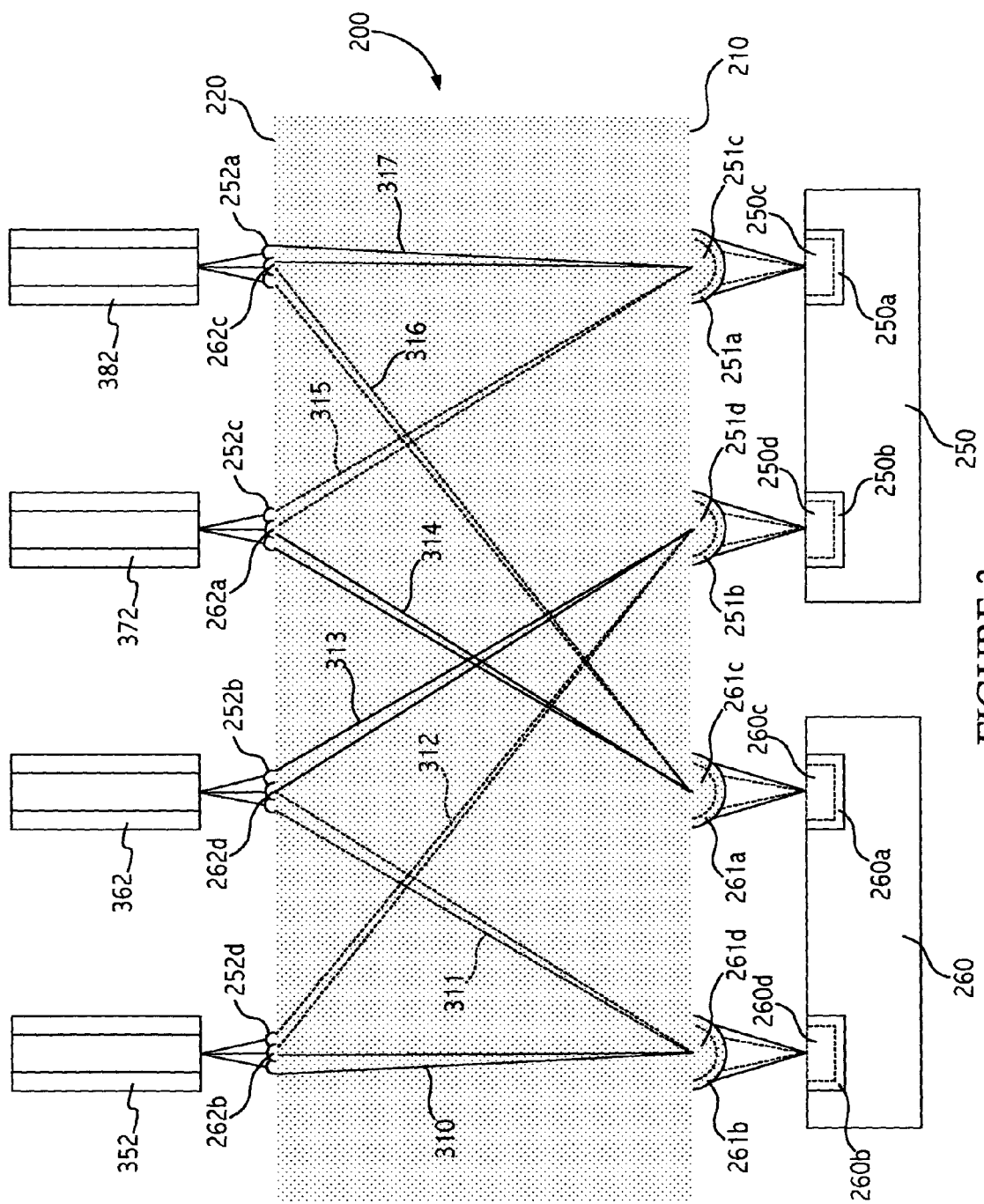
FIG. 3 shows a side view of an embodiment in accordance with the invention.

In accordance with an embodiment of the invention, FIG. 2a shows VCSELs 250a–250d, 260a–260d, 270a–270d, 280a–280d on VCSEL die 250, 260, 270, 280, respectively, labeled to illustrate how light is optically directed from individual VCSELs into optical fibers 352, 362, 372, 382 by filterless parallel WDM multiplexer 200 (see FIG. 3). Each VCSEL on each die emits one of four different wavelengths so that there are four VCSELs emitting at each wavelength.

In accordance with an embodiment of the invention FIG. 2b shows first lens plane 210 of filterless parallel WDM multiplexer 200 (see FIG. 3). Lenses 251a–d, 261a–d, 271a–d, 281a–d belong to lens groups 201, 202, 203, 204, respectively. Each of lenses 251a–d, 261a–d, 271a–d, 281a–d in first lens plane 210 is offset in the horizontal plane with respect to VCSELs 250a–d, 260a–d, 270a–d, 280a–d, respectively, according to the requirements discussed above. This allows light coming from the VCSELs 250a–d, 260a–d, 270a–d, 280a–d through lenses 251a–d, 261a–d, 271a–d, 281a–d to be directed at an angle to intersect corresponding lenses 252a–d, 262a–d, 272a–d, 282a–d in second lens plane 220 of filterless parallel WDM multiplexer 200 (see FIG. 3).

Figure 2C:
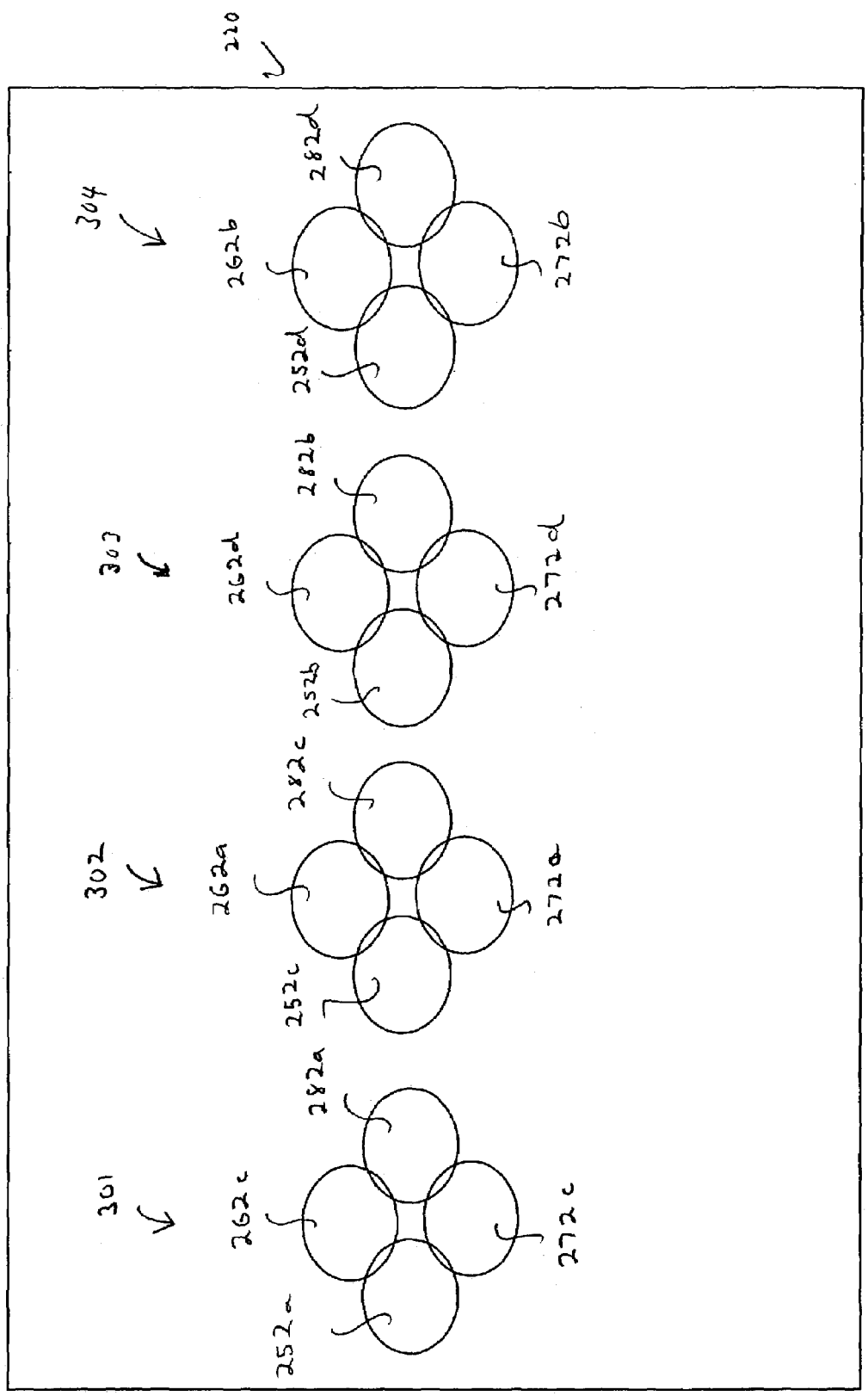
FIG. 2c shows a second plane of lenses in an embodiment in accordance with the invention.

FIG. 2c shows how light from first lens plane 210 of filterless parallel WDM multiplexer 200 (see FIG. 3) is mapped into lenses 252a–d, 262a–d, 272a–d, 282a–d of second lens plane 220 of filterless parallel WDM multiplexer 200 (see FIG. 3) as viewed from the optical fiber side. Lenses 252a–d, 262a–d, 272a–d, 282a–d in second lens plane 220 of filterless parallel WDM multiplexer 200 are positioned so that light from lens groups 301, 302, 303, 304 is focused into optical fibers 352, 362, 372, 382 (see FIG. 3), respectively. Starting from the nine o'clock position in each group and going clockwise, lens group 301 has lenses 252a, 262c, 282a, 272c; lens group 302 has lenses 252c, 262a, 282c, 272c, lens group 303 has lenses 252b, 262d, 282b, 272d; lens group 304 has lenses 252d, 262b, 282d, 272b. The axis of each optical fiber 352, 362, 372, 382 (see FIG. 3) is aligned with the center of lens groups 304, 303, 302, 301, respectively. Lenses in each lens group 304, 303, 302, 301 are positioned such that the four lenses in each group focus the light into optical fibers 352, 362, 372, 382, respectively. Light from lens 251a is directed to lens 252a; light from lens 251b is directed to lens 252b; light from lens 251c is directed to lens 252c; light from lens 251d is directed to lens 252d; light from lens 261a is directed to lens 262a; light from lens 261b is directed to lens 262b, light from lens 261c is directed to lens 262c, light from lens 261d is directed to lens 262d; light from lens 271a is directed to lens 272a; light from lens 271b is directed to lens 272b; light from lens 271c is directed to lens 272c; light from lens 271d is directed to lens 272d; light from lens 281a is directed to lens 282a; light from lens 271b is directed to lens 282b; light from lens 281c is directed to lens 282c; light from lens 281d is directed to lens 282d.

The mapping of the light beams between first lens plane 210 and second lens plane 220 is designed to minimize the largest required angular bending of the light within the configuration constraints. FIG. 3 shows a side view of the configuration shown in top view in FIGS. 2a–2c with VCSEL die 250 and 260 and the position of optical fibers 352, 362, 372, 382. VCSEL die 270 and 280 with the associated light beams and lenses are suppressed in FIG. 3 to aid clarity. Dashed lines in FIG. 3 relate to the hidden VCSELs 260d, 260c, 250d, 250c and corresponding hidden lenses 261d, 261c, 251d, 251c.

As shown in FIG. 3, filterless parallel WDM multiplexer 200 directs light from VCSELs 260a, 260b, 260c, 260d on VCSEL die 122 and from VCSELs 250a, 250b, 250c, 250d on VCSEL die 121 into optical fibers 352, 363, 372, 382. Filterless parallel WDM multiplexer 200 maps light beams 310, 311, 312, 313, 314, 315, 316, 317 from lens plane 210 to lens plane 220 and into optical fibers 352, 362, 372, 382.

Light beam 310 originates from VCSEL 260*b* passing through lens 261*b* to lens 262*b* and into optical fiber 352. Light beam 311 originates from VCSEL 260*d* passing through lens 261*d* to lens 262*d* and into optical fiber 362. Light beam 314 originates from VCSEL 260*a* passing through lens 261*a* to lens 262*a* and into optical fiber 372. Light beam 316 originates from VCSEL 260*c* passing through lens 261*c* to lens 262*c* and into optical fiber 382. Light beam 312 originates from VCSEL 250*d* passing through lens 251*d* to lens 252*d* and into optical fiber 252. Light beam 313 originates from VCSEL 250*b* passing through lens 251*b* to lens 252*b* and into optical fiber 362. Light beam 315 originates from VCSEL 250*c* passing through lens 251*c* to lens 252*c* and into optical fiber 372. Light beam 317 originates from VCSEL 250*a* passing through lens 251*a* to lens 252*a* and into optical fiber 382.

For filterless parallel WDM multiplexers in accordance with the invention such as filterless parallel WDM multiplexer element 176 or filterless parallel WDM multiplexer 200, micro-lens arrays are typically used in each plane and may be made up of either refractive or diffractive lenses. Refractive lenses offer the highest possible efficiency because with application of the appropriate anti-reflective coating most incident light is transmitted and refracted according to Snell's law. Typically, the less expensive methods used for fabricating refractive micro-lens arrays are restricted to spherical surface profiles while more expensive methods are typically needed for the fabrication of aspherical surface profiles. However, spherical profiles typically suffer from higher levels of aberration. Aspherical surface profiles typically have lower levels of aberration and result in lower overall optical losses. Further, most refractive micro-lens technologies are limited in the overall sagitta of the lenses that can be fabricated. Limitations on the height of the lenses limits focusing power and the degree of angular deflection that can be applied to the laser beam.

Diffractive lenses are typically less expensive to fabricate than refractive lenses. Diffractive lenses that approximate refractive lenses having complex aspherical surface profiles and large sagitta can be fabricated without extra expense. A typical disadvantage of diffractive optics lies in the area of efficiency. Only light that is diffracted into the correct diffraction order is properly focused with the remaining light being lost. Insertion losses per diffractive lens are typically in the range from about 1 dB to more than 3 dB. Specifically, diffraction efficiency typically declines as focusing power and angular deflection increase. When large angular deflections are needed, the insertion loss due to the diffraction efficiency may become substantial. Choices for using either refractive or diffractive lenses will depend on the particular embodiment in accordance with the invention given the issues of insertion loss and cost.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. A filterless multiplexer apparatus and method making comprising: a first plane comprising a first plurality of lens groups arranged in a first pattern; and a second plane positioned adjacent and substantially parallel to said first plane, said second plane comprising a second plurality of lens groups arranged in a second pattern denser than said first pattern, said first plurality of lens groups and said second plurality of lens groups together enabled to map light emitted from m light sources in a source plane positioned proximate to said first plane to n waveguides in a receiver plane positioned proximate to said second plane where m is a number greater than n, and wherein mapping is performed by said lens groups without the use of filters.

2. The apparatus of claim 1 wherein said first plane is a first side of an optically transparent wafer having said first side and a second side.

3. The apparatus of claim 2 wherein said second plane is said second side of said optically transparent wafer.

4. The apparatus of claim 2 wherein said optically transparent wafer is chosen from glass, plastic, silicon, GaAs, GaP and InP.

5. The apparatus of claim 1 wherein said second plurality of lens groups is comprised of micro-lens arrays.

6. The apparatus of claim 5 wherein said micro-lens arrays are comprised of diffractive lenses.

7. The apparatus of claim 1 wherein said first plane is on a first optically transparent wafer and said second plane is on a second optically transparent wafer.

8. The apparatus of claim 7 wherein said first optically transparent wafer and said second optically transparent wafer are separated by an air gap.

9. The apparatus of claim 1 wherein said waveguides are optical fibers.

10. The apparatus of claim 9 wherein said optical fibers are multimode fibers.

11. The apparatus of claim 1 wherein said light sources are comprised of VCSELs.

12. The apparatus of claim 11 wherein said VCSELs in a monolithic VCSEL array.

13. The apparatus of claim 1 wherein m is en integer multiple of n and the number of different wavelengths is m divided by n.

14. The apparatus of claim 1 wherein the number m is a equal to four times the number n.

15. The apparatus of claim 1 wherein at least one of said light sources is an edge emitting laser.

16. The apparatus of claim 15 wherein said first plurality of lens groups comprises biconic refractive lenses.

17. A method for making a filterless multiplexer apparatus comprising:
   providing a first plane comprising a first plurality of lens groups arranged in a first pattern; and
   providing a second plane positioned adjacent and substantially parallel to said first plane, said second plane comprising a second plurality of lens groups arranged in a second pattern denser than said first pattern, said first plurality of lens groups and said second plurality of lens groups together enabled to map light emitted from m light sources in a source plane positioned proximate to said first plane to n waveguides in a receiver plane positioned proximate to said second plane where m is a number greater than n.

18. The method of claim 17 wherein said first plurality of lens groups is comprised of micro-lens arrays.

19. The method of claim 17 wherein said first plane is a first side of an optically transparent wafer having said first side and a second side.

20. The apparatus of claim 17 wherein said light sources are comprised of VCSELs.

* * * * *

UNITED STATES PATENT AND TRADEMARK OFFICE
CERTIFICATE OF CORRECTION

PATENT NO. : 7,076,129 B2  Page 1 of 1
APPLICATION NO. : 10/428199
DATED : July 11, 2006
INVENTOR(S) : Brian E. Lemoff It is certified that error appears in the above-identified patent and that said Letters Patent is hereby corrected as shown below:

Column 6, Line 31, Claim 12, after "VCSELs" insert -- are --;

Column 6, Line 33, Claim 13, delete "en" and insert -- an --;

Column 6, Line 36, Claim 14, after "is" delete "a".

Signed and Sealed this

Fifteenth Day of June, 2010

David J. Kappos
*Director of the United States Patent and Trademark Office*